(12) United States Patent
Cho et al.

(10) Patent No.: US 7,190,607 B2
(45) Date of Patent: Mar. 13, 2007

(54) PHASE-CHANGE MEMORY ELEMENT DRIVER CIRCUITS USING MEASUREMENT TO CONTROL CURRENT AND METHODS OF CONTROLLING DRIVE CURRENT OF PHASE-CHANGE MEMORY ELEMENTS USING MEASUREMENT

(75) Inventors: Woo-yeong Cho, Gyeonggi-do (KR); Sang-beom Kang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/092,456

(22) Filed: Mar. 29, 2005

(65) Prior Publication Data

US 2005/0281073 A1 Dec. 22, 2005

(30) Foreign Application Priority Data

Jun. 19, 2004 (KR) ............... 10-2004-0045849

(51) Int. Cl.
*G11C 11/00* (2006.01)
(52) U.S. Cl. ............... 365/148; 365/158; 365/163
(58) Field of Classification Search ............... 365/148, 365/163
See application file for complete search history.

(56) References Cited

U.S. PATENT DOCUMENTS

| | | | |
|---|---|---|---|
| 6,466,481 B1 | 10/2002 | Pasotti et al. | |
| 6,487,113 B1* | 11/2002 | Park et al. | 365/163 |
| 6,687,153 B2* | 2/2004 | Lowrey | 365/165 |
| 7,050,328 B2* | 5/2006 | Khouri et al. | 365/163 |
| 2004/0114444 A1 | 6/2004 | Matsuoka | |
| 2004/0246804 A1 | 12/2004 | Cho et al. | |
| 2005/0068804 A1* | 3/2005 | Choi et al. | 365/154 |
| 2005/0141261 A1* | 6/2005 | Ahn | 365/148 |
| 2005/0169093 A1 | 8/2005 | Choi et al. | |

FOREIGN PATENT DOCUMENTS

EP 1 326 258 7/2003
EP 1 426 969 6/2004

OTHER PUBLICATIONS

European Search for European patent application No. 05 01 2604 completed on Oct. 6, 2005.
Preliminary Notice of First Official Action for Taiwanese Application No. 094118699; dated Oct. 11, 2006.
English translation of Preliminary Notice of First Official Action for Taiwanese Application No. 094118699; dated Oct. 11, 2006.

* cited by examiner

*Primary Examiner*—Tan T. Nguyen
(74) *Attorney, Agent, or Firm*—Myers Bigel Sibley & Sajovec

(57) ABSTRACT

Programming phase-change memory devices and driver circuits for programming phase-change memory devices are provided that control an amount of current supplied to a phase-change material of the phase-change memory device based on a measure of resistance of the phase-change material during programming of the phase-change memory device. Such control may be based on detected voltage or current. The amount of current supplied to the phase-change material may be increased until the measured voltage level changes with respect to a reference voltage value and the current maintained constant if the measured voltage level has changed with respect to the reference voltage value. The change of the measured voltage level with respect to the reference voltage may be the measured voltage level falling below the reference voltage value.

32 Claims, 8 Drawing Sheets

PHASE-CHANGE MEMORY ELEMENT DRIVER CIRCUITS USING MEASUREMENT TO CONTROL CURRENT AND METHODS OF CONTROLLING DRIVE CURRENT OF PHASE-CHANGE MEMORY ELEMENTS USING MEASUREMENT

RELATED APPLICATIONS AND CLAIM OF PRIORITY

This application is related to and claims priority from Korean Patent Application No. 2004-45849, filed on Jun. 19, 2004, in the Korean Intellectual Property Office, the disclosure of which is incorporated by reference herein in its entirety.

FIELD OF THE INVENTION

The present invention relates to driver circuits for memory elements, and more particularly, to driver circuits and/or methods for phase-change memory elements.

BACKGROUND OF THE INVENTION

A phase-change memory element is a memory element for storing information using the characteristics of electric conductivity or a resistance difference between a crystalline phase and an amorphous phase of a specific phase-change material. The phase-change memory element forms a memory cell electrically connected to a transistor element or the like, formed on a semiconductor substrate for addressing and read/write operations of the device. In the memory element, information is stored using a conductivity difference in accordance with the phase-change of a memory layer, and data is stored in the phase-change memory element including a phase-change region.

FIG. 1A and FIG. 1B illustrate a conventional phase-change memory cell 10. As seen in FIG. 1A, the phase-change memory cell includes a phase-change material 14 between a top electrode 12 and a bottom electrode 18. To increase the current density and, thereby, improve the efficiency of heating of the phase-change material 14, the bottom electrode 18 may be connected to the phase-change material 14 through a bottom electrode contact (BEC) 16 that has reduced surface area in comparison to the bottom electrode 18. An access transistor 20 may be connected to the bottom electrode 18 and controlled by a word line (WL).

As seen in FIGS. 1A, 1B and 2, the phase-change memory cell 10 operates such that a current flowing through the phase-change material 14 electrically heats a phase-change region, and the structure of the phase-change material 14 is reversibly changed to a crystalline state (FIG. 1A) or an amorphous state (FIG. 1B) to store information. The stored information can be read by flowing a relatively low current through the phase-change region and measuring the resistance of the phase-change material.

In setting the phase-change material layer 14 to an amorphous state or a crystalline state, different pulses may be used to control the heating of the phase-change material layer. As seen in FIG. 3, a high temperature short duration heating cycle 35 is used to reset the phase-change material 14 to an amorphous state and a longer duration lower temperature heating cycle 36 is used to set the phase-change material 14 to a crystalline state. In particular, in the short duration cycle 35, the phase-change material 14 is heated to a temperature above the melting point, Tm, of the phase-change material and then quickly cooled, e.g., within a few nanoseconds, to create an amorphous region in the phase-change material 14. In the longer duration cycle 36, the phase-change material 14 is heated to a temperature above a crystallizing point, Tx, and below the melting point, Tm, of the phase-change material and maintained at that temperature for a predetermined time before cooling to create a crystallized region in the phase-change material 14. Thus, the temperature is maintained within a set window of above the crystallizing temperature Tx and below the melting temperature Tm.

FIG. 4 is a graph of the voltage-current relationship for a typical phase-change material 14. As seen in FIG. 4, the graph is divided into a reset state, 1, and a set state, 3, for a read operation and a section, 2, for programming the state of the phase-change material 14. Thus, in reading the phase-change material, states 1 or 3, the current to voltage relationship is linear based on the resistance of the phase-change material. However, the programming section, 2, is non-linear. Accordingly, to program the phase-change material 14 the voltage is increased to above the threshold voltage and the current increases to the minimum programming current non-linearly.

In an array of memory cells, the different memory cells may have different threshold voltages and, accordingly, different minimum set currents. Thus, as seen in FIG. 4, for different cells, reflected in the lines labeled i, ii and iii, the threshold voltage and the minimum set current may vary. However, conventionally, all the memory cells are typically programmed with substantially the same current.

Furthermore, as seen in FIGS. 5A and 5B, a conventional phase-change memory device 500 may have difficulty controlling the voltage applied to the memory cells to assure that all of the memory cells exceed the threshold voltage. As seen in FIG. 5A, a current mirror controls the current supplied to program the memory cells 510 such that the cell current ICELL is controlled by the reference current IREF. During programming from the reset state to the set state, if a voltage lower than the threshold voltage Vth of the phase-change material 14 is supplied to the phase-change material 14, the voltage level of the data line DL is close to the level of the power supply voltage VDD. If the amount of set current ICELL supplied to the PCM is increased by increasing the reference current IREF, a level of the voltage supplied to the PCM may be increased beyond the threshold voltage Vth. Thus, the resistance of the phase-change material changes to the dynamic resistance and the voltage level of the data line DL becomes lower than the level of the power supply voltage VDD. Such a change in voltage may be problematic where the different memory cells have different threshold voltages and may cause some cells to not be set if the same current is applied to all the cells as the voltage may not reach the threshold voltage, reduction of reset current may also cause difficulty in fitting the set current into the narrowed set window and it may be difficult to maintain the voltage and/or current in the set window as illustrated in FIG. 5B for all of the devices.

SUMMARY OF THE INVENTION

Some embodiments of the present invention provide for programming a phase-change memory device by controlling an amount of current supplied to a phase-change material of the phase-change memory device based on a measure of resistance of the phase-change material during programming of the phase-change memory device.

In particular embodiments of the present invention, controlling an amount of current includes measuring a voltage across the phase-change material of the phase-change memory device and controlling an amount of current supplied to the phase-change material of the phase-change memory device based on the measured voltage across the phase-change material. Furthermore, controlling an amount of current supplied may include increasing the amount of current supplied to the phase-change material until the measured voltage level changes with respect to a reference voltage value and maintaining the current constant if the measured voltage level has changed with respect to the reference voltage value. The change of the measured voltage level with respect to the reference voltage may be the measured voltage level falling below the reference voltage value.

In still further embodiments of the present invention, increasing the amount of current supplied to the phase-change material until the measured voltage level changes with respect to a reference voltage value includes increasing the amount of a reference current supplied to a current mirror circuit so as to increase an amount of current supplied to the phase-change material until the measured voltage level changes with respect to a reference voltage value controlling an amount of current supplied. A node of the current mirror that controls the current supplied to the phase-change material may be precharged and, in some embodiments, precharged responsive to a power on signal. In further embodiments, a node where the voltage across the phase-change material is detected is precharged. For example, the node that is precharged may be a data line of the phase-change memory device.

In still further embodiments of the present invention where current supplied to the phase-change material is supplied by a current mirror circuit, maintaining the current constant includes floating a node of the current mirror that controls the current supplied to the phase-change material when voltage falls below reference voltage.

In additional embodiments of the present invention, controlling an amount of current includes measuring a current supplied to the phase-change material of the phase-change memory device and controlling an amount of current supplied to the phase-change material of the phase-change memory device based on the measured current supplied to the phase-change material. Furthermore, controlling an amount of current supplied may include increasing the amount of current supplied to the phase-change material until the measured current changes with respect to a reference current value and maintaining the current constant if the measured current has changed with respect to the reference current value. The change of the measured current with respect to the reference voltage may be the measured current exceeding the reference current value.

Some embodiments of the present invention provide phase-change memory devices, that includes a phase-change memory cell comprising a phase-change material, a detection circuit configured to measure a voltage and/or current of a data line coupled to the phase-change memory cell and a controller circuit coupled to the phase-change memory cell and configured to control an amount of current supplied to the phase-change material of the phase-change memory cell based on an output of the detection circuit.

In particular embodiments of the present invention, the detection circuit comprises a voltage detection circuit. The voltage detection circuit may be configured to compare the measured voltage of the data line and a reference voltage and output a control signal based on whether the measured voltage is greater than or less than the reference voltage. The controller circuit may include a current mirror circuit configured to increase an amount of current supplied to the phase-change memory cell until the control signal output by the voltage detection circuit indicates that the measured voltage is less than the reference voltage and maintain the amount of current supplied to the phase-change memory cell when the control signal output by the voltage detection circuit indicates that the measured voltage is less than the reference voltage.

In still further embodiments of the present invention, the current mirror circuit is further responsive to a first control signal to control whether or not current is supplied to the phase-change memory cell. The current mirror circuit may include a first transistor having controlled terminals coupled between a data line of the phase-change memory cell and a supply voltage, a charge storage element coupled between a controlling terminal of the first transistor and the supply voltage, a second transistor responsive to the first control signal that selectively couples the controlling terminal of the first transistor to the supply voltage and a third transistor responsive to a second control signal and an output of the voltage detection circuit for selectively coupling the controlling terminal of the first transistor and the charge storage element to a ground voltage. In some embodiments, the charge storage element comprises a metal-oxide-semiconductor capacitor.

In additional embodiments of the present invention, the detection circuit comprises a current detection circuit. The current detection circuit may be configured to compare the measured current of the data line and a reference current and output a control signal based on whether the measured current is greater than or less than the reference current. Furthermore, the controller circuit may include a current mirror circuit configured to increase an amount of current supplied to the phase-change memory cell until the control signal output by the current detection circuit indicates that the measured current is less than the reference current and maintain the amount of current supplied to the phase-change memory cell when the control signal output by the current detection circuit indicates that the measured current is greater than the reference current.

Some embodiments of the present invention provide phase-change memory write drive circuits that include a current detection circuit coupled to a data line of a phase-change memory and a current generation circuit responsive to a control signal and coupled to the data line of the phase-change memory. The current generation circuit is configured to supply current to the data line of the phase-change memory responsive to the control signal and to increase an amount of current supplied to the data line of the phase-change memory until the current detection circuit indicates that a current measured by the current detection circuit is greater than a reference current and maintain the amount of current supplied to the phase-change memory when the current measured by the current detection circuit indicates that the measured current is greater than the reference current.

Further embodiments of the present invention provide phase-change memory write drive circuits that include a voltage detection circuit coupled to a data line of a phase-change memory and a current generation circuit responsive to a control signal and coupled to the data line of the phase-change memory. The current generation circuit is configured to supply current to the data line of the phase-change memory responsive to the control signal and to increase an amount of current supplied to the data line of the phase-change memory until the voltage detection circuit indicates that a voltage measured by the voltage detection circuit is less than a reference voltage and maintain the amount of current supplied to the phase-change memory when the voltage measured by the voltage detection circuit indicates that the measured voltage is less than the reference voltage.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
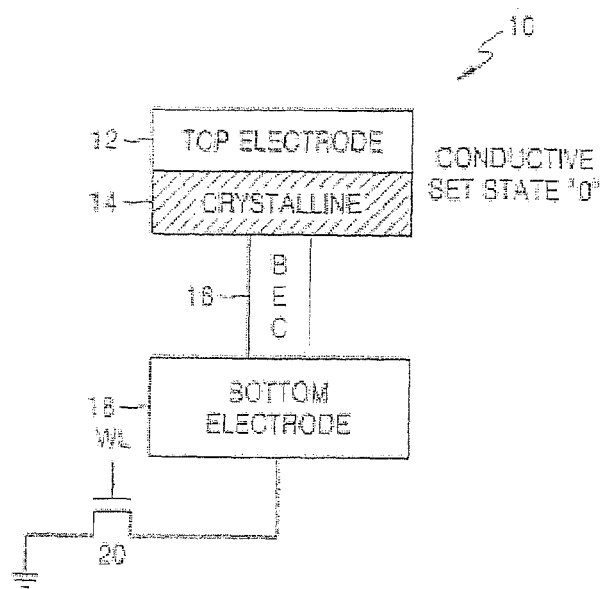
FIGS. 1A and 1B are illustrations of a phase-change memory cell.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Some embodiments of the present invention provide phase-change memories and/or methods of operating phase-change memories that control the amount of current supplied to a phase-change memory cell based on a detection of a change in resistance of the memory cell. Embodiments of the present invention are described herein with reference to the change in resistance of the memory cell being detected based on a voltage change, however, the change in resistance could also be detected based on a current change. Accordingly, embodiments of the present invention should not be construed as limited to the particular illustrative examples provided herein.

Figure 6:
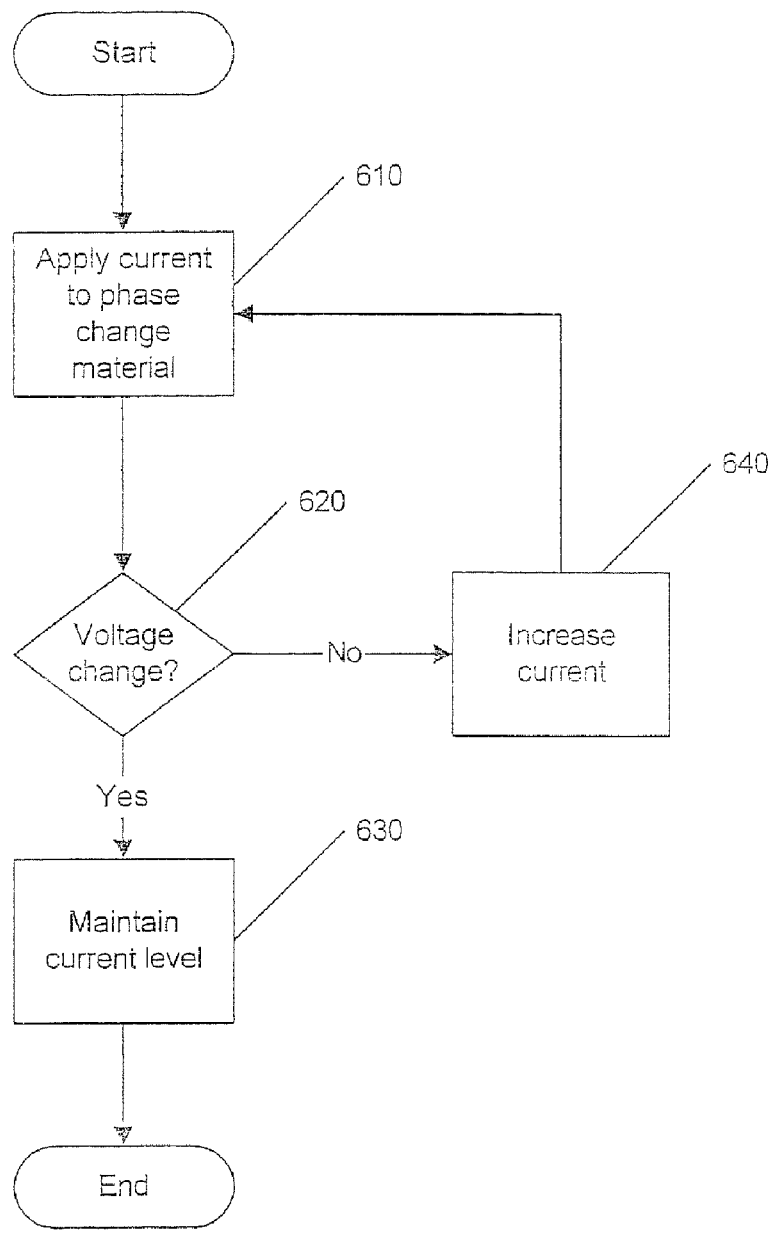
FIG. 6 is a flowchart illustrating operations for driving a phase-change memory cell according to some embodiments of the present invention.

FIG. 6 is a flowchart illustrating operations for programming a phase-change memory cell according to some embodiments of the present invention. As seen in FIG. 6, a phase-change memory cell is programmed by applying current to the phase-change material at a first level (block 610). The voltage across the phase-change material is monitored (block 620) and if a change in the voltage is not detected (block 620), the level of current supplied to the phase-change material is increased (blocks 640 ad 610).

When a change in voltage across the phase-change material is detected that indicates that the resistance level of the phase-change material has changed (block 620), the current level supplied to the phase-change material is maintained at that level (block 630). For example, the current may be increased to the phase-change material until the voltage corresponding to the current exceeds the threshold voltage and then the current is maintained at a constant level. Thus, despite the narrow set window, the current and voltage applied to the phase-change material may be maintained in a stable manner. In particular embodiments, the change in resistance of the phase-change material may be detected by measuring the voltage level of a data line of the phase-change memory. Such a control of the current may be provided on a bit line by bit line or cell by cell basis.

Figure 7:
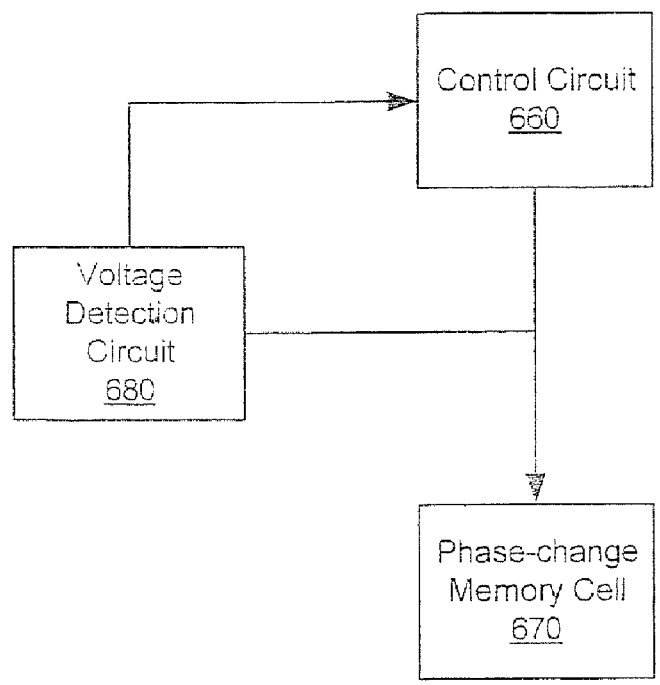
FIG. 7 is a block diagram of a phase-change memory cell and driver circuit according to some embodiments of the present invention.

FIG. 7 is a block diagram of a phase-change memory device according to some embodiments of the present invention. As seen in FIG. 7, the phase-change memory device includes a control circuit 660, a phase-change memory cell 670 and a voltage detection circuit 680. The voltage detection circuit 680 is configured to measure a voltage of a data line coupled to the phase-change memory cell. The control circuit 660 is coupled to the phase-change memory cell 670 and configured to control an amount of current supplied to the phase-change material of the phase-change memory cell 670 based on an output of the detection circuit 680. The phase-change memory cell 670 may be a conventional phase-change memory cell as illustrated, for example, in FIGS. 1A, 1B and 2.

The voltage detection circuit 680 is configured to compare the measured voltage of the data line and a reference voltage and output a control signal based on whether the measured voltage is greater than or less than the reference voltage. The controller circuit 660 may be provided by a current mirror circuit configured to increase an amount of current supplied to the phase-change memory cell until the control signal output by the voltage detection circuit 680 indicates that the measured voltage is less than the reference voltage and maintain the amount of current supplied to the phase-change memory cell 670 when the control signal output by the voltage detection circuit indicates that the measured voltage is less than the reference voltage. The reference voltage may be established based on the ratio of the set resistance to the reset resistance of the phase-change material. In some embodiments the ratio may be greater than 100.

Figure 8:
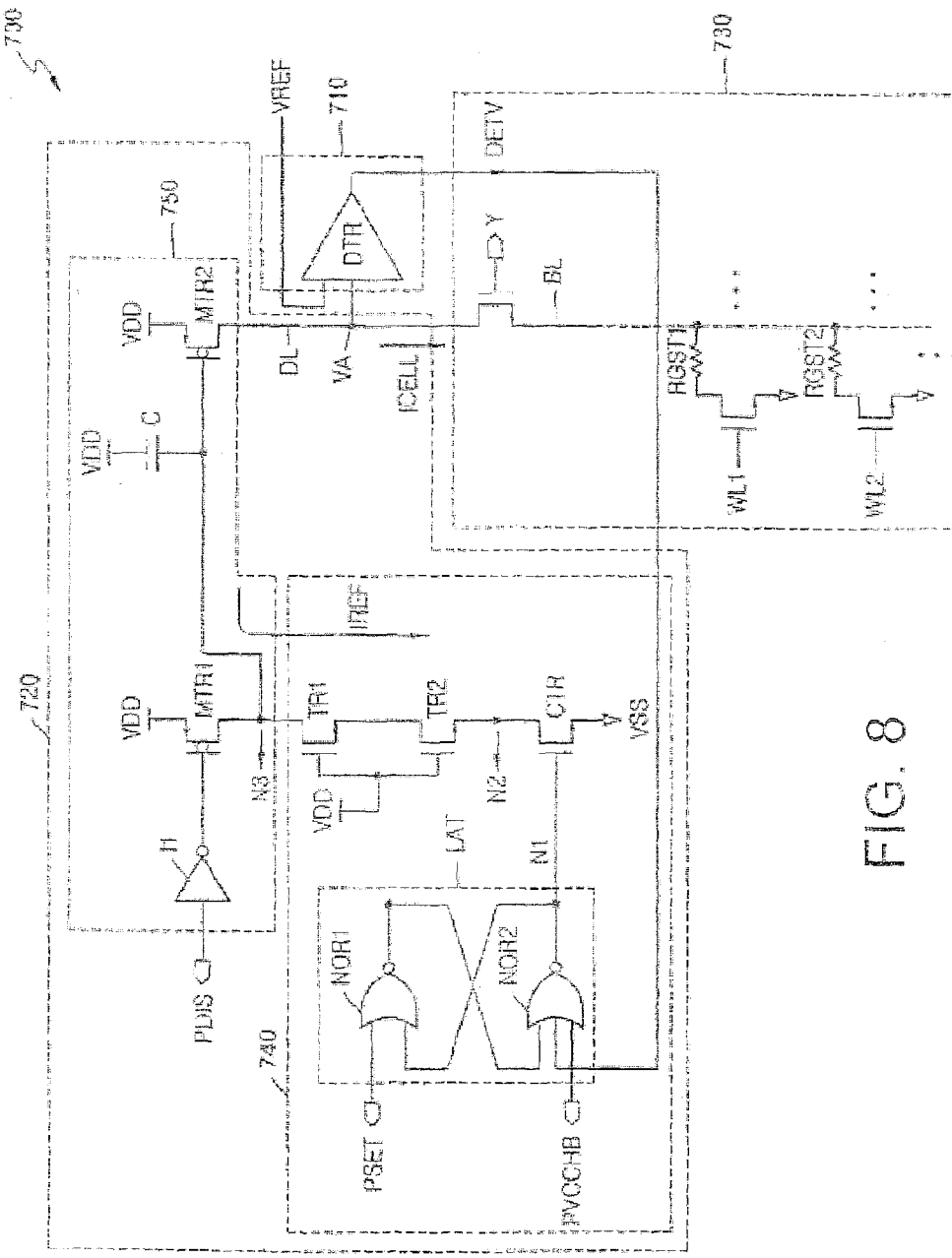
FIG. 8 is a schematic illustration of a phase-change memory and driver circuit according to some embodiments of the present invention.

FIG. 8 is a circuit diagram of a phase-change memory device 700 according to some embodiments of the present invention. As seen in FIG. 8, the phase-change memory device 700 includes a detection circuit 710, a controller 720 and a memory array 730. The detection circuit 710 may provide the detection circuit 680 of FIG. 7, the controller 720 may provide the controller circuit 660 of FIG. 7 and the memory array 730 may provide the phase-change memory cell 670 of FIG. 7, in some embodiments.

As is further illustrated in FIG. 7, the controller 720 may include a current generator controller unit 740 and a current generator 750. The current generator controller unit 740 and the current generator 750 may provide a current mirror circuit such that the current ICELL supplied to the memory array 730 by the current generator 750 is controlled by the current IREF in the current generator controller unit 740. The current generator 750 is responsive to a first control signal PDIS that controls whether or not the current ICELL is supplied to the phase-change memory cell of the memory array 730 and charges capacitor C up to the VDD level before a set operation.

The memory array 730 may include a plurality of phase-change memory cells that are interconnected by bit lines and selected by word lines. For example, the bit line BL may be coupled to multiple phase-change memory cells that are individually controlled by access transistors coupled to word lines (WL1, WL2, . . . ) of the memory array 730. Each memory cell may include a phase-change material and a respective phase change material is illustrated in FIG. 7 as RGST1, RGST2, etc. Current supplied to the bit line passes through the phase-change material of phase-change memory cells for which the word line is active and may be controlled as described herein to program the state of the phase-change material of the phase-change memory cell.

The current generator controller unit 740 and the current generator 750 may receive three control signals. A first control signal PDIS controls whether the current generator 750 drives the memory array 730 and charges node N3 up to the VDD level. A second control signal PSET provides a set pulse that is activated to place the phase-change material of a selected phase-change memory cell(s) into a set state. A third signal PVCCHB may be activated once during a power-up sequence and/or before every write operation of the semiconductor memory device 700 to provide an initialization of a flip-flop circuit LAT.

As is seen in FIG. 8, the controller 720 includes a first transistor MTR2 having controlled terminals coupled between a data line (the bit line BL) of the phase-change memory cell and a supply voltage VDD. A charge storage element (the capacitor C) is coupled between a controlling terminal of the first transistor MTR2 and the supply voltage VDD or the ground voltage VSS. A second transistor MTR1 is responsive to the first control signal and selectively couples the controlling terminal of the first transistor MTR2 to the supply voltage VDD to control the flow of current to the data line. A third transistor CTR is responsive to a second control signal PSET and an output DETV of the detection circuit 710 for selectively coupling the controlling terminal of the first transistor MTR2 and the charge storage element C to a ground voltage VSS. The charge storage element C may be provided by a metal-oxide-semiconductor capacitor.

The current generator controller unit 740 includes a latch LAT that operates as a set/reset latch with the reset state overriding the set state. Thus, the NOR gates NOR1 and NOR2 are cross-coupled and have as a SET input the PSET signal and as reset inputs the PVCCHB signal and the feedback signal DETV output by the detection circuit 710. The current generator controller unit 740 further includes a control transistor CTR having its controlling terminal coupled to the output of the set/reset latch LAT and which controls the current flow from the node N3 through the transistors TR1 and TR2 which acts as an active resistor R. By using the charge storage element C and the active resistor R, the node voltage of N3 can be decreased slowly from VDD to VSS with an RC time constant.

The detection circuit 710 is provided by a voltage comparator DTR that compares the voltage at the node VA with a reference voltage. Because the change in resistance between the SET state and the RESET state of the phase-change memory cells is large, the reference voltage level need only be set to a voltage between the voltage level for the phase-change memory cell when the memory cell is in a SET state and when it is in a RESET state. If the voltage at the node VA is greater than the reference voltage, the detection circuit 710 outputs the signal DETV as a low value and if the voltage at the node VA is less than the reference voltage, the detection circuit 710 outputs the signal DETV as a high value.

As is further illustrated in FIG. 8, the current from the current generator 750 may be selectively provided to the bit line through a pass transistor that may be controlled by an enable signal Y.

Operation of the phase-change memory device 700 will now be described in further detail with reference to FIGS. 9 and 10. At power on, the PVCCHB signal provides a reset pulse to set the output of the latch LAT to a known state. The PSET signal is low indicating that an operation to place the memory cell(s) in a SET state is not being performed. Thus, after the reset pulse of PVCCHB is received, the node N1 is set to a low state and the transistor CTR is turned off. Furthermore, the control signal PDIS is high and so the output of the inverter 11 is low and the NMOS transistor MTR1 is turned on so that the capacitor C is precharged to VDD and the node N3 is at VDD so that the transistor MTR2 is off. Furthermore, a separate transistor could be provided to precharge the node VA. Such a transistor could precharge the node VA responsive to the control signal PDIS such that the node VA and the node N3 were both charged to near VDD. The node N3 and/or the node VA may be charged to near VDD responsive to a power on signal.

When the phase-change memory cell is to be programmed to a SET state, the control signal PDIS transitions to a low level and the control signal PSET transitions to a high level. When PDIS goes low and PSET goes high, the transistor MTR1 is turned off and the set/reset latch LAT is set so that the node N1 goes high and the transistor CTR turns on. Thus, the capacitor C begins to discharge through the transistors TR1, TR2 and CTR. Accordingly, the voltage at the node N3 decreases as illustrated by the signal VN3 in FIGS. 9 and 10. As the voltage at the node N3 decreases the transistor MTR2 provides increased current ICELL to the phase memory cells. While the current ICELL is increased, the current ICELL is illustrated as a substantially flat line for ICELL in FIGS. 9 and 10 during this period because of the scale of the drawing. Thus, as the voltage at node N3 (VN3) decreases, ICELL increases.

When the phase-change memory cell changes state such that the resistance of the phase-change material changes, the current ICELL increases and the voltage at the node VA decreases below the reference voltage VREF. Thus, the signal DETV transitions from low to high and the latch LAT is reset so that the node N1 is at a low state and the transistor CTR turns off which floats the node N3 and stops the decrease in the voltage VN3 at the node N3. The duration for which VN3 decreases is typically about 10 ns. Accordingly, the increase in current provided by the transistor MTR2 is stopped and the current is maintained at substantially the same amount of current provided when the DETV signal turned off the transistor CTR. The current ICELL is maintained at this level until the signal PDIS transitions to a high level which turns on the transistor MTR1 that pulls the node N3 to nearly VDD and turns off the transistor MTR2. Thus, the duration of the current supplied to the memory cell may be controlled by the duration of the signal PDIS.

Figures 9, 10:
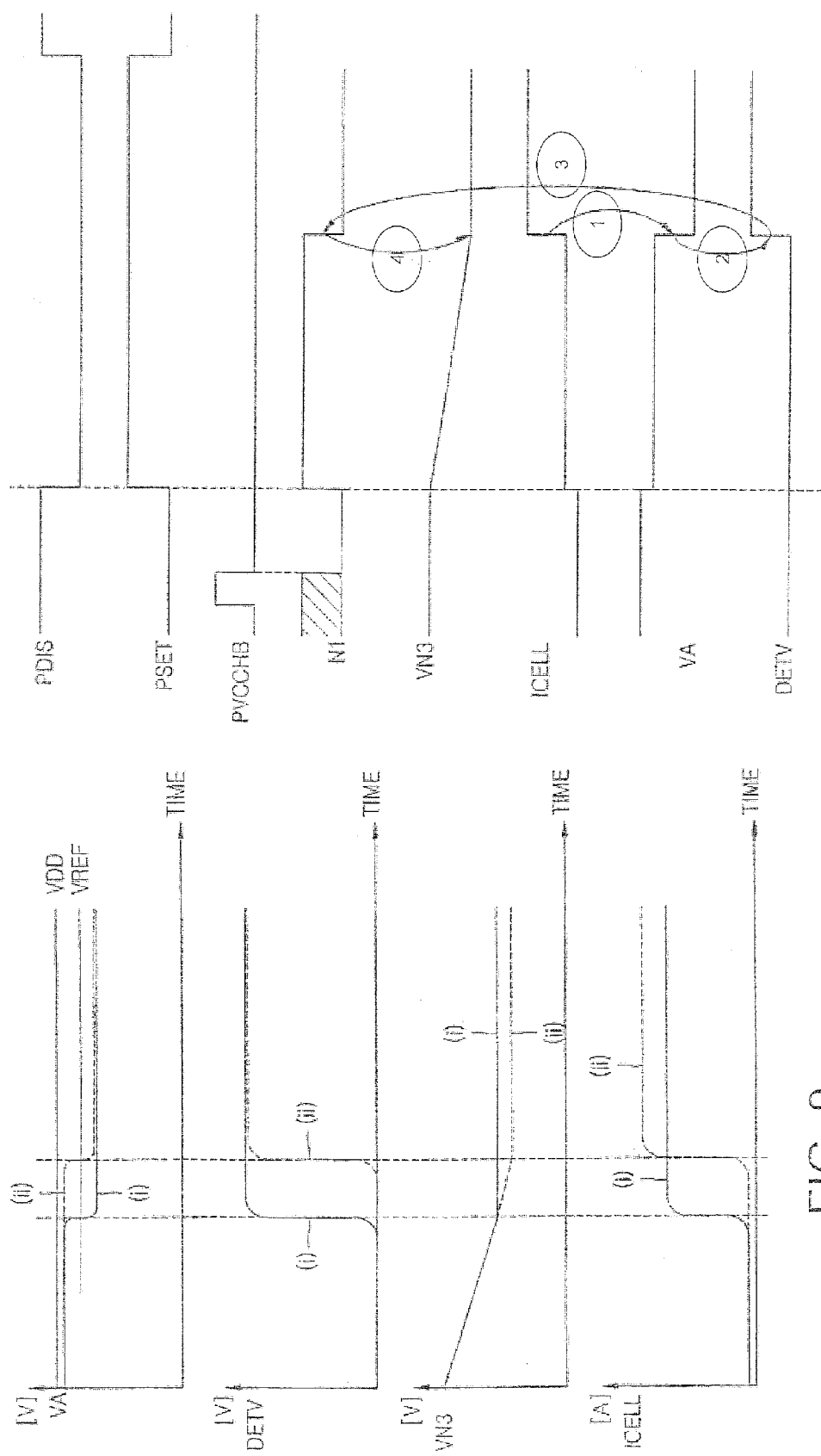
FIGS. 9 and 10 are timing diagrams illustrating the operation of the circuit of FIG. 8.

As seen in FIG. 9, if the threshold voltage, Vth, differs between memory cells, the current level at which the voltage VA drops below the reference voltage will differ. However, because the level of current supplied is based on the detection of the voltage change at the node VA, the voltage VN3 will continue to drop and the current ICELL will increase until the threshold voltage is reached. Accordingly, memory cells with different threshold voltages may be provided different levels of current based on the characteristics of the individual memory cells.

While embodiments of the present invention have been described with reference to voltage detection of the voltage at the node VA, the detection circuit 710 could also be provided as a current detection circuit. Thus, the voltage comparator DTR could be replaced with a current sense amplifier and the current ICELL could be monitored to detect that it has exceeded a reference current level to generate the control signal DETV. Accordingly, embodiments of the present invention should not be construed as limited to voltage detection techniques but may utilize any technique for detecting the change in resistance of the phase-change memory cell and maintaining the current supplied to the cell at a constant level after detection of the change in resistance.

Embodiments of the present invention could also be utilized in combination with other phase-change memory programming techniques, such as, for example, in combination with the phase-change memories that control pulse duration based on a detected state of the memory that are described in U.S. Patent Publication No. 2004/0246804 and published Dec. 9, 2004, the disclosure of which is incorporated herein by reference as if set forth in its entirety.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of programming a phase-change memory device, comprising:
controlling an amount of current supplied to a phase-change material of the phase-change memory device based on a measure of resistance of the phase-change material during programming of the phase-change memory device;
increasing the amount of current supplied to the phase-change material until the resistance of the phase-change material changes; and
maintaining the amount of current as constant if the resistance of the phase-change material changes responsive to the increasing amount of current.

2. The method of claim 1, wherein controlling an amount of current comprises:
measuring a voltage across the phase-change material of the phase-change memory device; and
controlling an amount of current supplied to the phase-change material of the phase-change memory device based on the measured voltage across the phase-change material.

3. The method of claim 2, wherein controlling an amount of current supplied comprises:
increasing the amount of current supplied to the phase-change material until the measured voltage level changes with respect to a reference voltage value; and
maintaining the current constant if the measured voltage level has changed with respect to the reference voltage value.

4. The method of claim 3, wherein the change of the measured voltage Level with respect to the reference voltage comprises the measured voltage level failing below the reference voltage value.

5. The method of claim 3, wherein increasing the amount of current supplied to the phase-change material until the measured voltage level changes with respect to a reference voltage value comprises increasing the amount of a reference current supplied to a current mirror circuit so as to increase an amount of current supplied to the phase-change material until the measured voltage level changes with respect to a reference voltage value controlling an amount of current supplied.

6. The method of claim 5, further comprising precharging a node of the current mirror that controls the current supplied to the phase-change material.

7. The method of claim 6, wherein precharging the node is responsive to a power on signal.

8. The method of claim 5, further comprising precharging a node where the voltage across the phase-change material is detected.

9. The method of claim 8, wherein the node that is precharged comprises a data line of the phase-change memory device.

10. The method of claim 3, wherein current supplied to the phase-change material is supplied by a current mirror circuit and wherein maintaining the current constant comprises floating a node of the current mirror that controls the current supplied to the phase-change material when the measured voltage falls below reference voltage.

11. The method of claim 1, wherein controlling an amount of current comprises:
measuring a current supplied to the phase-change material of the phase-change memory device; and
controlling an amount of current supplied to the phase-change material of the phase-change memory device based on the measured current supplied to the phase-change material.

12. The method of claim 11, wherein controlling an amount of current supplied comprises:
increasing the amount of current supplied to the phase-change material until the measured current changes with respect to a reference current value; and
maintaining the current constant if the measured current has changed with respect to the reference current value.

13. The method of claim 12, wherein the change of the measured current with respect to the reference voltage comprises the measured current exceeding the reference current value.

14. A phase-change memory device, comprising:
a phase-change memory cell comprising a phase-change material;
a detection circuit configured to measure a voltage and/or current of a data line coupled to the phase-change memory cell; and
a controller circuit coupled to the phase-change memory cell and configured to control an amount of current supplied to the phase-change material of the phase-change memory cell based on an output of the detection circuit, wherein the controller circuit comprises a current mirror circuit.

15. The phase-change memory device of claim 14, wherein the detection circuit comprises a voltage detection circuit.

16. The phase-change memory device of claim 15, wherein the voltage detection circuit is configured to compare the measured voltage of the data line and a reference voltage and output a control signal based on whether the measured voltage is greater than or Less than the reference voltage.

17. The phase-change memory device of claim 16, wherein the controller circuit comprises a current mirror circuit configured to increase an amount of current supplied to the phase-change memory cell until the control signal output by the voltage detect ion circuit indicates that the measured voltage is less than the reference voltage and maintain the amount of current supplied to the phase-change memory cell when the control signal output by the voltage detection circuit indicates that the measured voltage is less than the reference voltage.

18. The phase-change memory device of claim 17, where the current mirror circuit is further responsive to a first control signal to control whether or not current is supplied to the phase-change memory cell.

19. The phase-change memory device of claim 18, wherein the current mirror circuit comprises:
a first transistor having controlled terminals coupled between a data line of the phase-change memory cell and a supply voltage;
a charge storage element coupled between a controlling terminal of the first transistor and the supply voltage;
a second transistor responsive to the first control signal that selectively couples the controlling terminal of the first transistor to the supply voltage; and
a third transistor responsive to a second control signal and an output of the voltage detection circuit for selectively coupling the controlling terminal of the first transistor and the charge storage element to a ground voltage.

20. The phase-change memory device of claim 19, wherein the charge storage element comprises a metal-oxide-semiconductor capacitor.

21. The phase-change memory device of claim 14, wherein the detection circuit comprises a current detection circuit.

22. The phase-change memory device of claim 21, wherein the current detection circuit is configured to compare the measured current of the data line and a reference current and output a control signal based on whether the measured current is greater than or less than the reference current.

23. The phase-change memory device of claim 22, wherein the controller circuit comprises a current mirror circuit configured to increase an amount of current supplied to the phase-change memory cell until the control signal output by the current detection circuit indicates that the measured current is less than the reference current and maintain the amount of current supplied to the phase-change memory cell when the control signal output by the current detection circuit indicates that the measured current is greater than the reference current.

24. A phase-change memory device, comprising:
a phase-change memory cell comprising a phase-change material; and
means for controlling an amount of current supplied to the phase-change material of the phase-change memory cell based on a measure of resistance of the phase-change material during programming of the phase-change memory cell;
means for increasing the amount of current supplied to the phase-change material until the resistance of the phase-change material changes; and
means for maintaining the amount of current as constant if the resistance of the phase change material changes.

25. The phase-change memory device of claim 24, wherein the means for controlling a current comprises:
means for measuring a voltage across the phase-change material of the phase-change memory device; and
means for controlling an amount of current supplied to the phase-change material of the phase-change memory device based on the measured voltage across the phase-change material.

26. The phase-change memory device of claim 25, wherein the means for controlling an amount of current supplied comprises:
- means for increasing the amount of current supplied to the phase-change material until the measured voltage level changes with respect to a reference voltage value; and
- means for maintaining the amount of current constant if the measured voltage level has changed with respect to the reference voltage value.

27. The phase-change memory device of claim 26, wherein the amount of constant current is substantially the same as the amount to which the current was increased prior to the change in measured voltage.

28. The phase-change memory device of claim 24, wherein means for controlling an amount of current comprises:
- means for measuring a current supplied to the phase-change material of the phase-change memory device; and
- means for controlling an amount of current supplied to the phase-change material of the phase-change memory device based on the measured current supplied to the phase-change material.

29. The phase-change memory device of claim 28, wherein the means for controlling an amount of current supplied comprises:
- means for increasing the amount of current supplied to the phase-change material until the measured current changes with respect to a reference current value; and
- means for maintaining the current constant if the measured current has changed with respect to the reference current value.

30. The phase-change memory device of claim 29, wherein the change of the measured current with respect to the reference voltage comprises the measured current exceeding the reference current value.

31. A phase-change memory write drive circuit, comprising:
- a current detection circuit coupled to a data line of a phase-change memory;
- a current generation circuit responsive to a control signal and coupled to the data line of the phase-change memory and configured to supply current to the data line of the phase-change memory responsive to the control signal and to increase an amount of current supplied to the data line of the phase-change memory until the current detection circuit indicates that a current measured by the current detection circuit is greater than a reference current and maintain the amount of current supplied to the phase-change memory when the current measured by the current detection circuit indicates that the measured current is greater than the reference current.

32. A phase-change memory write drive circuit, comprising:
- a voltage detection circuit coupled to a data line of a phase-change memory;
- a current generation circuit responsive to a control signal and coupled to the data line of the phase-change memory and configured to supply current to the data line of the phase-change memory responsive to the control signal and to increase an amount of current supplied to the data line of the phase-change memory until the voltage detection circuit indicates that a voltage measured by the voltage detection circuit is less than a reference voltage and maintain the amount of current supplied to the phase-change memory when the voltage measured by the voltage detection circuit indicates that the measured voltage is less than the reference voltage.

* * * * *

UNITED STATES PATENT AND TRADEMARK OFFICE
CERTIFICATE OF CORRECTION

PATENT NO. : 7,190,607 B2  Page 1 of 1
APPLICATION NO. : 11/092456
DATED : March 13, 2007
INVENTOR(S) : Cho et al.

Figure 1B:
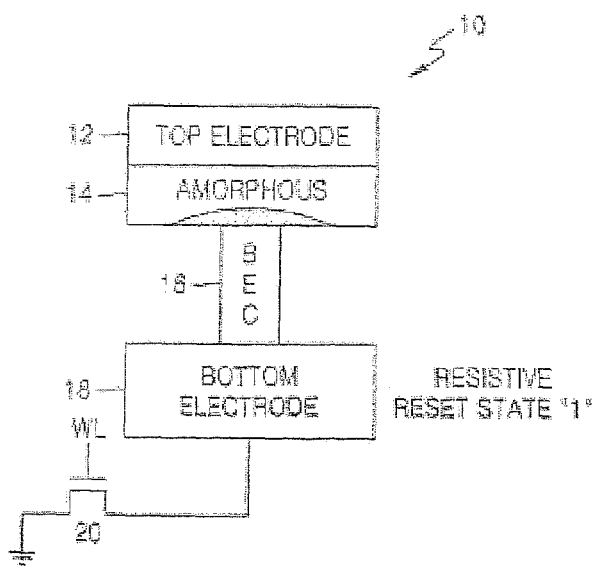
Figure 2:
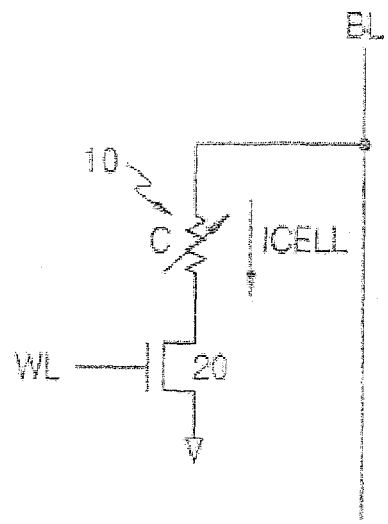
FIG. 2 is a schematic diagram of a phase-change memory cell.
Figure 3:
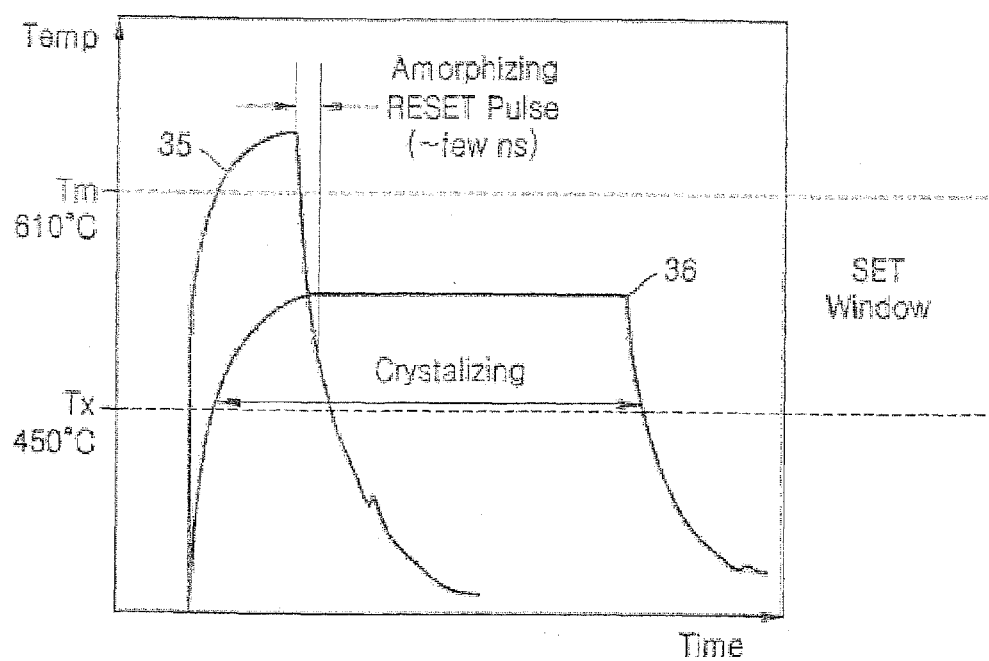
FIG. 3 is graph illustrating the change in state of a phase-change material as a function of time and temperature.
Figure 4:
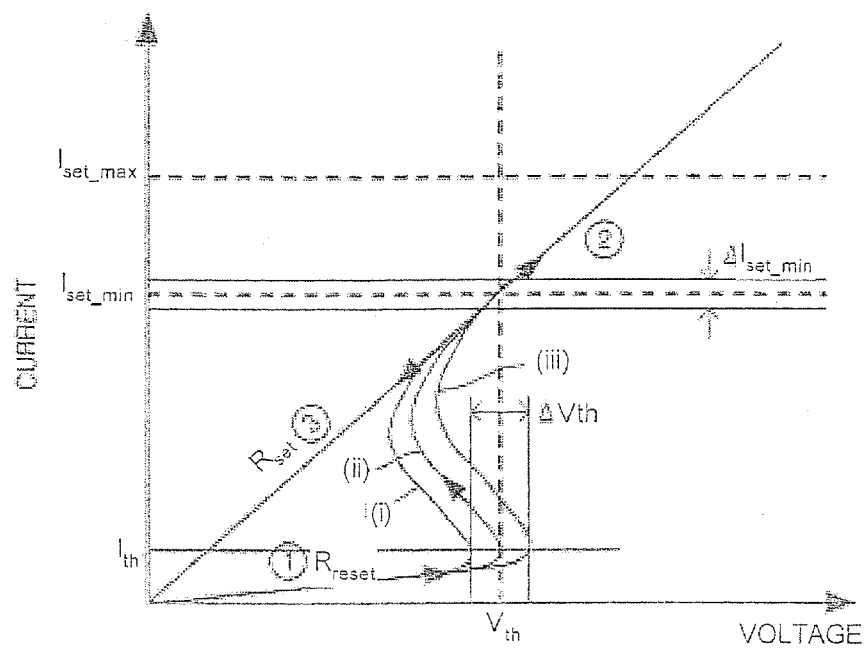
FIG. 4 is a graph illustrating the current and voltage relationship for a phase-change material.
Figure 5A:
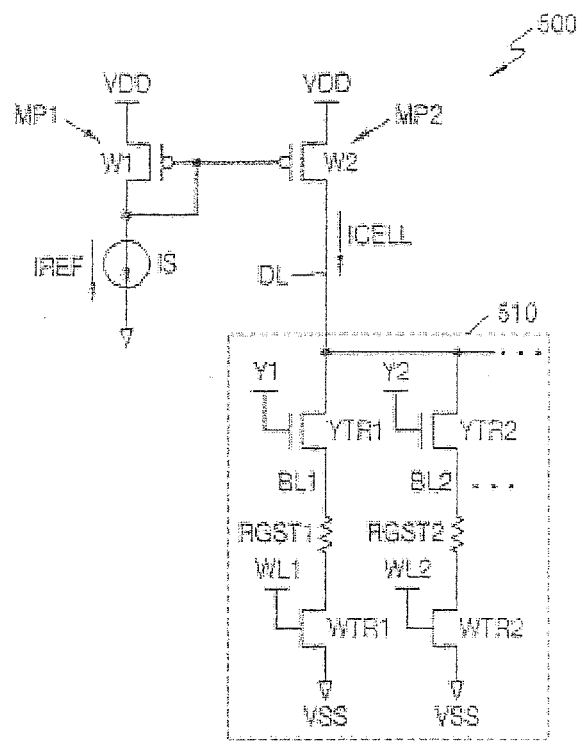
FIG. 5A is a schematic illustration of a conventional driver circuit and phase-change memory cells.
Figure 5B:
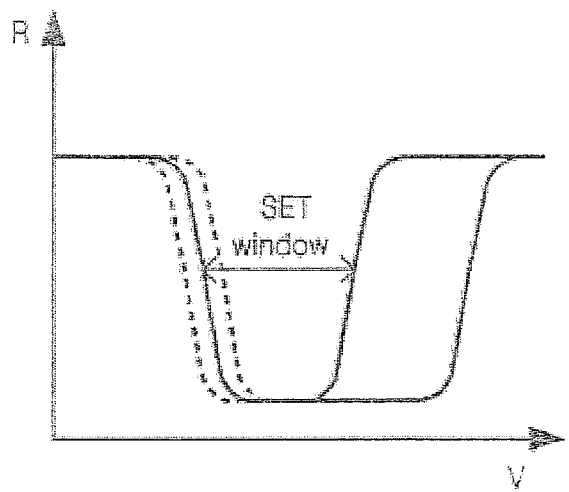
FIG. 5B is a graph of resistance versus voltage for a phase-change memory cell.

It is certified that error appears in the above-identified patent and that said Letters Patent is hereby corrected as shown below:

In The Drawings:
Sheet 1 of 8: Fig. 1A and Fig. 1B should read --Prior Art--

Column 10,
Line 59: Please Correct Claim 4 To Read --The method of claim 3, wherein the change of the measured voltage level with respect to the reference voltage comprises the measured voltage level falling below the reference voltage value.--

Column 11,
Line 59: Please Correct "measured voltage is greater than or Less"
To Read -- measured voltage is greater than or less--

Line 65: Please Correct "output by the voltage detect ion"
To Read --output by the voltage detection--

Signed and Sealed this

Nineteenth Day of June, 2007

JON W. DUDAS
*Director of the United States Patent and Trademark Office*